(12) United States Patent
Xu et al.

(10) Patent No.: US 7,446,459 B2
(45) Date of Patent: Nov. 4, 2008

(54) HYBRID PIEZOELECTRIC ENERGY HARVESTING TRANSDUCER SYSTEM

(75) Inventors: Tian-Bing Xu, Hampton, VA (US);
Xiaoning Jiang, State College, PA (US);
Ji Su, Yorktown, VA (US); Paul W. Rehrig, Marlborough, PA (US); Wesley S. Hackenberger, State College, PA (US)

(73) Assignees: National Institute of Aerospace Associates, Hampton, VA (US); The United States of America as represented by the Administrator of NASA, Washington, DC (US)

( * ) Notice: Subject to any disclaimer, the term of this patent is extended or adjusted under 35 U.S.C. 154(b) by 143 days.

(21) Appl. No.: 11/486,200

(22) Filed: Jul. 13, 2006

(65) Prior Publication Data
US 2008/0238260 A1    Oct. 2, 2008

Related U.S. Application Data

(60) Provisional application No. 60/699,106, filed on Jul. 14, 2005.

(51) Int. Cl.
*H01L 41/113* (2006.01)
*H01L 41/04* (2006.01)
(52) U.S. Cl. ............. 310/339; 310/330; 310/331
(58) Field of Classification Search ........... 310/339, 310/330–332
See application file for complete search history.

(56) References Cited

U.S. PATENT DOCUMENTS 3,947,644 A    3/1976    Uchikawa

| 6,232,702 | B1 | 5/2001 | Newham et al. |
| 6,407,484 | B1 | 6/2002 | Oliver et al. |
| 6,438,242 | B1 | 8/2002 | Howarth |
| 6,492,762 | B1 | 12/2002 | Pant et al. |
| 6,614,143 | B2 | 9/2003 | Zhang et al. |
| 6,768,246 | B2 | 7/2004 | Pelrine et al. |
| 6,994,762 | B2 * | 2/2006 | Clingman et al. ........... 156/160 |
| 2005/0057123 | A1 * | 3/2005 | Deng ......................... 310/339 |
| 2005/0134149 | A1 | 6/2005 | Deng et al. |
| 2005/0168108 | A1 * | 8/2005 | Face ........................... 310/330 |

OTHER PUBLICATIONS

Hyeoung Woo Kim, et al., "Energy Harvesting Using a Piezoelectric "Cymbal" Transducer . . . ", Japanese Journal of Applied Physics, vol. 43, No. 9A, 2004, pp. 6178-6183, The Japan Society of Applied Physics, published Sep. 9, 2004.

* cited by examiner

*Primary Examiner*—Darren Schuberg
*Assistant Examiner*—Derek J Rosenau
(74) *Attorney, Agent, or Firm*—George F. Helfrich; Kimberly A. Chasteen; Barry V. Gibbens

(57) ABSTRACT

A hybrid piezoelectric energy harvesting transducer system includes: (a) first and second symmetric, pre-curved piezoelectric elements mounted separately on a frame so that their concave major surfaces are positioned opposite to each other; and (b) a linear piezoelectric element mounted separately on the frame and positioned between the pre-curved piezoelectric elements. The pre-curved piezoelectric elements and the linear piezoelectric element are spaced from one another and communicate with energy harvesting circuitry having contact points on the frame. The hybrid piezoelectric energy harvesting transducer system has a higher electromechanical energy conversion efficiency than any known piezoelectric transducer.

6 Claims, 3 Drawing Sheets

HYBRID PIEZOELECTRIC ENERGY HARVESTING TRANSDUCER SYSTEM

CROSS-REFERENCE TO RELATED APPLICATION

This application claims the benefit of U.S. Provisional Application No. 60/699,106, filed on Jul. 14, 2005 for "Hybrid Force/Stress Amplified Piezoelectric Energy Transducer System".

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Cooperative Agreement No. NCC-1-02043 awarded by the National Aeronautics and Space Administration.

BACKGROUND OF THE INVENTION

1. Field of the Invention

This invention relates generally to energy harvesting systems. It relates particularly to piezoelectric transducers for the concersion of mechanical energy to electrical energy.

2. Description of Related Art

Mobile computing, communication, and sensing devices have grown significantly in the past decade, as have various sensor networks, now used in a broad spectrum of applications. The demand has been increasing for a lightweight power supply having low volume, a high energy density, and a long lifetime. For a large integrated system such as an aircraft or ship, central electric power can be supplied to sensors and control units at each component; however, wiring from the central power source has been a big burden for these systems, and there have been concerns about system maintenance and reliability. A distributed system such as an environmental monitoring system requires thousands of various sensors, signal processing units, and local power supplies. Electronics consumers have long desired compact and long lifetime power supplies for small systems such as body wear (cell phone, PALM, DVD player, etc.)

Research and development efforts to address these problems can be divided into two main areas: batteries and energy harvesting. Advances in various batteries have indeed enhanced the capabilities of many devices; however, the operating lifetime of a battery-powered system limits system deployment time.

Energy harvesting is, then, an alternative approach to reclaim energy from available sources in the system's environment and to convert it into electrical energy to power a control system. Several exploited ambient sources include solar, heat/thermal, electromagnetic, RF, and mechanical vibration sources. Of these, mechanical vibration sources are varied in their origin, and the amount of power to be harvested therefrom is abundant. Electromagnetic and piezoelectric transducers are two major devices for energy harvesting in vibration environments. Piezoelectric transduction is well known to have a higher energy density and less environmental interference than its electromagnetic counterpart.

Progress has been made in piezoelectric transducers for the conversion of mechanical energy (mechanical shock, strain, stress, vibrations, and acoustic waves) to electric energy. Piezoelectric transduction mechanisms studied so far include piezoelectric stack transducers, unimorph/bimorph transducers, and flextensional transducers. Of these, flextensional transducers have shown a higher energy conversion efficiency in comparison to the others because strain/stress amplification mechanisms are employed by configurational design. However, when pure compliant amplification mechanisms are used, energy waste still exists, indicating that more efficient electromechanical transduction mechanisms should be developed. On the other hand, piezoelectric materials play an important role in electromechanical transducers for energy harvesting. Piezo-ceramics, electroactive polymers(EAPs), and single crystal piezoelectric materials are the primary available materials at present. Of these, the EAP stack transducers previously reported show significantly high power output; however, net power output is small due to the consumption of the input DC-Bias field to convert the EAP from electric to piezoelectric status.

Piezoelectric transducers with a very high energy conversion efficiency are required in broad variety of advanced technologies, but they are yet unavailable in the art.

BRIEF SUMMARY OF THE INVENTION

It is accordingly the primary object of the present invention to provide what is not available in the art, viz., a hybrid force/stress amplified mechanism having a higher electromechanical energy conversion efficiency than any known piezoelectric transducer.

This primary object and its attending benefits are fully achieved by the provision of a hybrid piezoelectric energy harvesting transducer system which includes: (a) first and second symmetric, pre-curved piezoelectric elements in the form of sheets which are mounted separately at their ends on a frame so that concave major surfaces of these elements are positioned opposite to each other; (b) a linear piezoelectric element in the form of a sheet having no curvature and mounted separately at its ends on the frame and positioned thereon between the first and second pre-curved piezoelectric elements; (c) the first and second pre-curved piezoelectric elements and the linear piezoelectric element being spaced from one another and all communicating with energy harvesting circuitries which have contact points located on the frame upon which all of the piezoelectric elements are mounted.

BRIEF DESCRIPTION OF THE SEVERAL VIEWS OF THE DRAWINGS

For a more complete understanding of the present invention, including its primary object and attending benefits, reference should be made to the Detailed Description of the Invention, which is set forth below. This Detailed Description should be read in the light of the accompanying Drawings, wherein.

DETAILED DESCRIPTION OF THE INVENTION

The present invention is a hybrid force/stress amplified mechanism having a higher electromechanical energy conversion efficiency than any known piezoelectric transducer.

Figure 1:
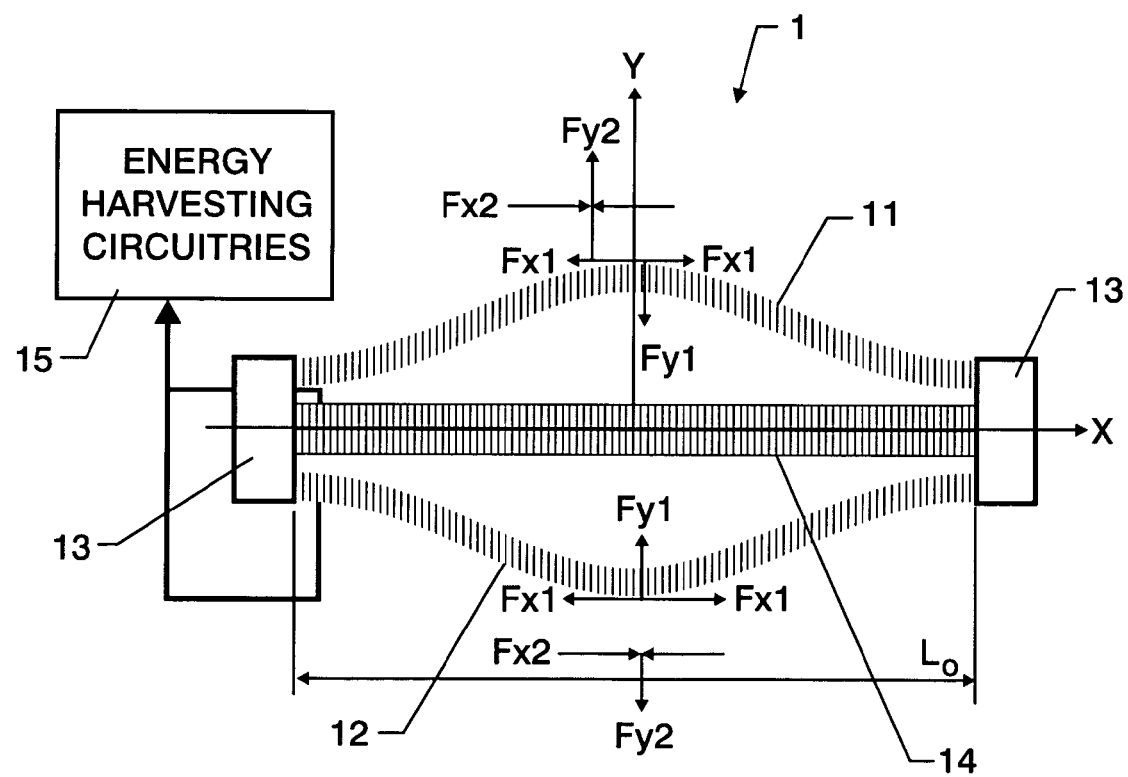
FIG. 1 is a schematic depicting a preferred embodiment of a hybrid piezoelectric energy harvesting transducer system according to the present invention.

Referring now to the Drawings, FIG. 1 schematically depicts a preferred embodiment 1 according to the present invention. This embodiment 1 includes a first symmetric, pre-curved piezoelectric element 11 and a second symmetric, pre-curved piezoelectric element 12, both of which are in the form of sheets, and each of which has a convex and a concave major surface. Elements 11 and 12 are mounted separately at their ends on frame 13 so that their concave major surfaces are positioned opposite to each other.

Embodiment 1 also includes linear piezoelectric element 14, which is mounted separately at its ends on frame 13, and positioned on frame 13 between first pre-curved piezoelectric element 11 and second pre-curved piezoelectric element 12, and spaced therebetween.

Piezoelectric elements 11, 12, and 14 all communicate with electrical energy harvesting circuitry 15, which is well-known to those having skill in this art. Electrical energy harvesting circuitry 15 has contact points located on frame 13, upon which piezoelectric elements 11, 12, and 14 are mounted. Since the phase of element 14 may be different from elements 11 and 12, the electric circuitry for element 14 will be different.

When a contracting force Fy1 is applied to the center of pre-curved elements 11 and 12 in a direction perpendicular to the convex surfaces thereof, an amplified contracting force Fx1 is produced along the pre-curved elements 11 and 12 in a direction at right angles to the applied contracting force. Moreover, an equivalent stretching force Fx2 is produced on linear piezoelectric element 14.

Furthermore, when a stretching force Fy2 is applied to the center of elements 11 and 12 in a direction perpendicular to the concave surfaces thereof, an amplified stretching force Fx2 is produced along elements 11 and 12 in directions at right angles to the applied stretching force Fy2. Moreover, an equivalent contracting force Fx2 is produced on element 14.

Each of the piezoelectric elements 11, 12, and 14 induce electrical energy simultaneously when a contracting force or a stretching force is applied thereto.

It is advantageous if the pre-curved and linear piezoelectric elements are made from a piezoelectric material which is one or more of piezoelectric ceramics, piezoelectric single crystals, piezoelectric polymers, and piezoelectric composites. They may be single elements or multilayer stacks having one kind or more than one kind of material therein.

When employed, piezoelectric ceramics are one or more of lead zirconate titanate, barium titanate, lead magnesium niobate-lead titanate ceramic, lead zinc niobate-lead magnesium niobate-lead titanate ceramic, lead titanate, and lead lanthanum zirconate titanate.

When employed, piezoelectric single crystals are one or more of lead magnesium niobate-lead titanate single crystal, lead zinc niobate-lead titanate single crystal, barium titanate single crystal, strontium barium niobate single crystal, lithium niobate single crystal, lithium tantalite single crystal, and lead barium niobate single crystal.

When employed, piezoelectric polymers are one or more of polyvinylidene fluoride, poly(vinylidene fluoride-trifluoroethylene), and polyimides, among others.

A hybrid force/stress amplified piezoelectric energy harvesting transducer system 1 is shown in FIG. 1. Elements 11 and 12 are symmetric pre-curved piezoelectric elements; element 14 is a linear piezoelectric element. When a contracting force Fy1 is applied to the center of elements 11 and 12 along the Y direction, the system will produce an amplified contracting force (Fx1) along the X direction on each of the pre-curved elements 11 and 12, and an equivalent stretching force (−2Fx1) on element 14. On the other hand, when a stretching force Fy2 is applied to the center of elements 11 and 12 along Y direction, the system will produce an amplified stretching force (Fx2) along the X direction on each of the precurved elements 11 and 12 and an equivalent contracting force (−2Fx2) on element 14. The amplification coefficient (k) is dependent on the pre-curved condition and the elastic properties of the elements 11 and 12.

The relation of $F_x$ and $F_y$ can be expressed as ($F_x$ and $F_y$ are mean static forces for the following comparisons and example calculations)

$$Fx = \frac{F_y}{2}\tan(\theta) = M\frac{F_y}{2} \qquad (1)$$

Where θ is the angle between the curved element 11 and the Y axis, and M is the magnification of the force/stress in the system.

Properly pre-curved conditions can increase the amplification coefficient by more than 100 times.

The curvature will follow this relationship:

$$z(-x)=z(x)$$

$$z(x_1) \leq z(x_2) \quad |x_1| > |x_2| \qquad (2)$$

It is optimized during a specific design according to the technical requirement and the properties of the materials used in the device, to get high performance without damaging the device.

Figure 3A:
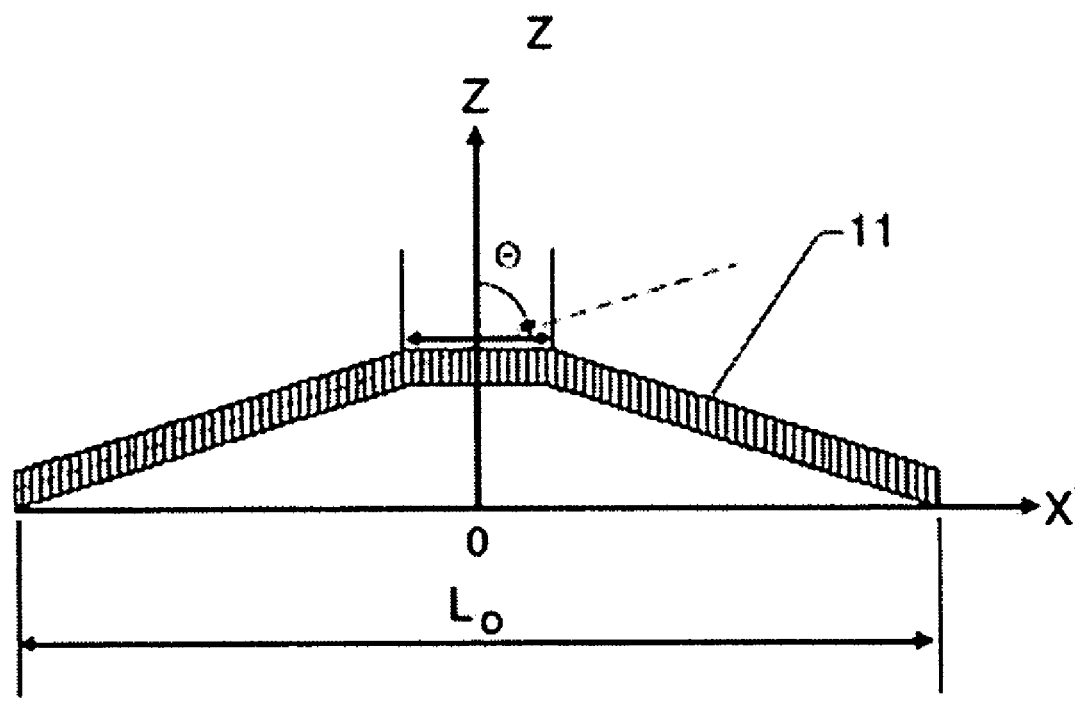
FIG. 3A and FIG. 3B are schematics illustrating force/stress distributions in the pre-curved piezoelectric elements of the present invention.

There are three special cases to be considered first, since they may give relatively uniform force/stress distribution in the curved elements:

Case 1: $b_0 \neq 0$ in FIG. 3A.

Conventional flextensional transducer is closest to this case.

$$z = \left|\frac{L_0}{2} - x\right| \cdot \tan\left(\frac{\pi}{2} - \theta\right) \quad \frac{b_0}{2} \leq |x| \leq \frac{L_0}{2}$$

$$z = \left|\frac{L_0}{2} - \frac{b_0}{2}\right| \cdot \tan\left(\frac{\pi}{2} - \theta\right) \quad |x| \leq \frac{b_0}{2}$$

Case 2: $b_0=0$ in FIG. 3A.

$$z = \left|\frac{L_0}{2} - x\right| \cdot \tan\left(\frac{\pi}{2} - \theta\right)$$

Figure 3B:
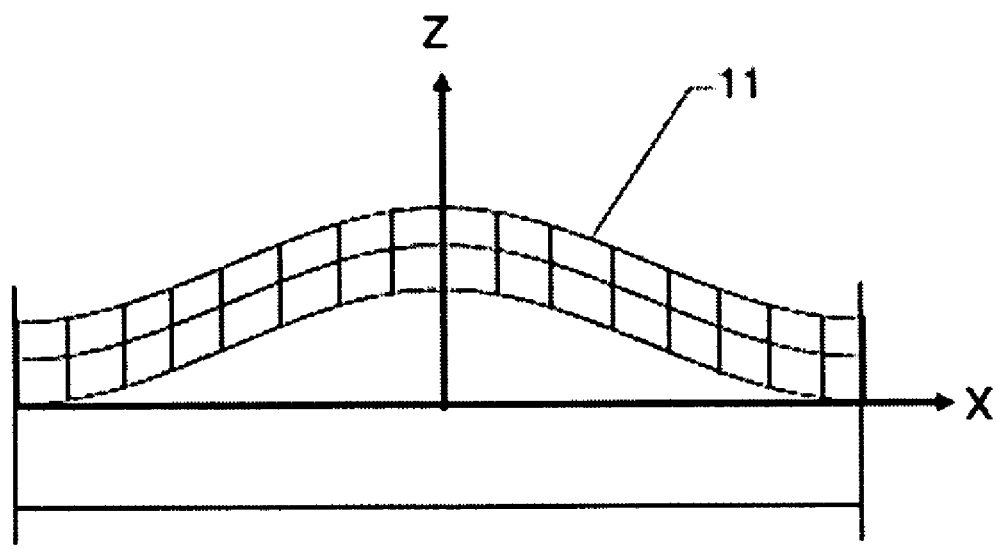

Complex Curvatures
Case 3: as shown in FIG. 3B.

$$z = c\left(\left(\frac{L'_0}{2}\right)^2 - x^2\right)^2$$

For this case, the stress will uniformly distribute in the curved elements.

The piezoelectric elements 11, 12, and 14 can be any piezoelectric material (e.g., ceramic, single crystal, or polymer) multilayer stacks, or single elements.

Piezoelectric Ceramic Materials

Lead zirconate titanate (PZT) (the most popular one),

Barium titanate (BaTiO$_3$), lead magnesium niobate-lead titanate ceramic (1-x)PbMg1/3Nb2/3O3-xPbTiO(3) (PMN-xPT), Lead zinc niobate-lead magnesium niobate-lead titanate ceramics [PbZn1/3Nb2/3O3-PbMg1/3Nb2/3O3-PbTiO3 (PZN-PMN-PT)], lead lanthanum zirconate titanate (PLZT).

Piezoelectric Single Crystal

Lead magnesium niobate-lead titanate single crystal (1-x)PbMg1/3Nb2/3O3-xPbTiO(3) (PMN-PT) (the most popular one), Lead zinc niobate-lead titanate single crystal (PZN-PT), Barium titanate (BaTiO$_3$) single crystal, Strontium Barium niobate crystal, Lithium niobate (LiNbO3) crystal, Lithium tantalate (LiTaO3), Lead barium niobate (PBN) crystal.

Piezoelectric Polymers

Polyvinylidene Fluoride (PVDF) (the most popular one),

Poly(vinylidene fluoride-trifluoroethylene) [P(VDF-TrFE)] copolymer,

Polyimide and polyimide based nano composites.

When a contracting or stretching force/stress is applied to the piezoelectric elements, each element will induce electric charges (i.e. electrical energy) simultaneously. The produced electrical energy can be a few tens to hundreds of times higher than that generated by conventional piezoelectric multilayer stack energy harvesters or conventional piezoelectric flextensional transducers. The present hybrid transducer system can convert environmental mechanical energy (mechanical shock, vibration, and acoustic wave) to electric energy.

Theoretical Evaluation of the Invented Concept

In order to evaluate the present hybrid transducer system concept, a theoretical demonstration is made on the comparison of the performance capability of the present concept with a conventional flextensional transducer and a multilayer stack transducer, i.e., the two most advanced piezoelectric energy harvesting transducers of the related art.

Figure 2:
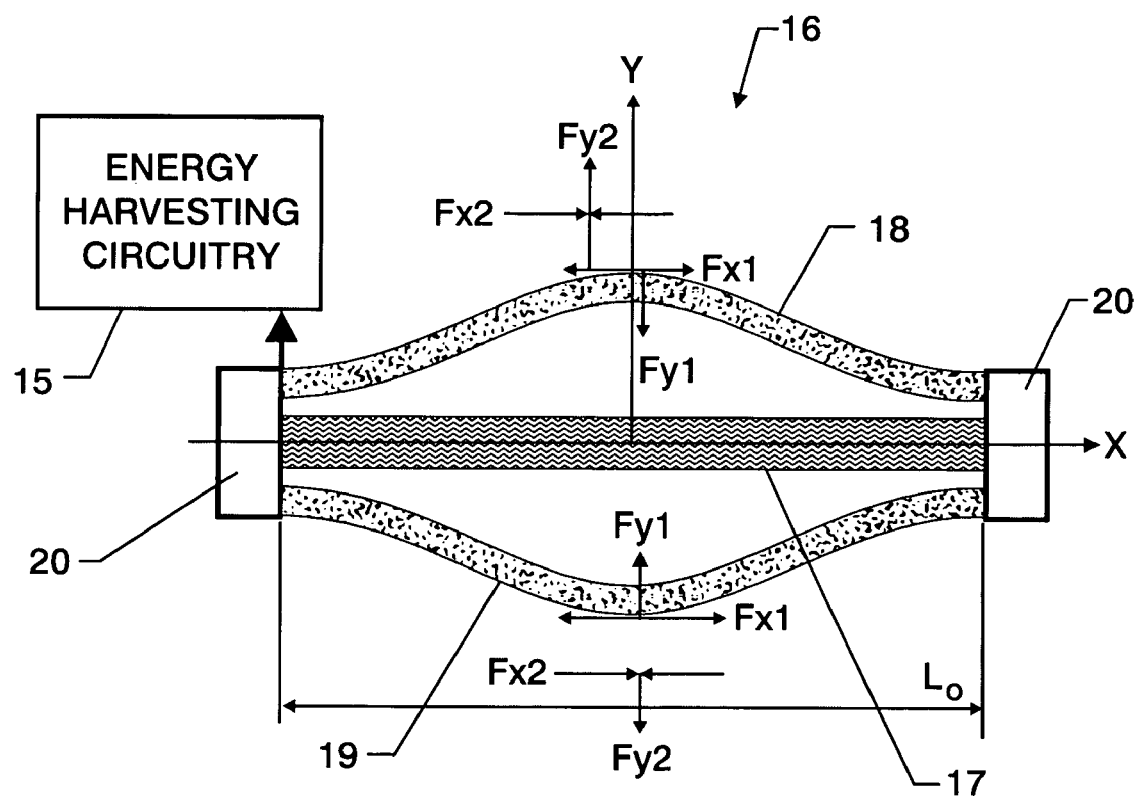
FIG. 2 is a schematic depicting a flextensional piezoelectric energy harvesting transducer system of the related art.

Comparison the Energy Harvesting Capability of the Present Hybrid Transducer System with a Conventional Flextensional Transducer A conventional flextensional transducer 16 is shown in FIG. 2. The central element 17 is a single piece of piezoelectric beam, typically is piezoelectric PZT ceramic with piezoelectric constant at range $d_{31}$=−250~−370 pC/N. The two outer pre-curved elements 18 and 19 are metal shells for force amplification. The two end frames 20, which are identical in the hybrid transducer system and the conventional transducer, hold the three elements together. Normally the pre-curved shells and the frame are made of the same material.

If the dimension for the active element 17 is length L, width W, and height $h_A$, then, the induced charge in element 17 ($Q_A$) will be $$Q_A = d_{31} * F_x = d_{31} * k * F_y \quad (3)$$

where k is the force amplification of the flextensional transducer, $F_x$ the amplified force at the two ends of the central element 17 at X direction, and $F_y$ the force applied to the flextensional transducer along the Y direction.

The capacitance ($C_A$) of the center active element 17 is $$C_A = \varepsilon_0 \varepsilon \frac{S}{h_A} = \varepsilon_0 \varepsilon \frac{LW}{h_A} \quad (4)$$

where $C_A$ is the capacitance of the element 17, $\varepsilon_0$ permittivity of vacuum, and $\varepsilon$ dielectric constant of the piezoelectric material.

The energy output ($P_A$) for element 17 is $$P_A = \frac{Q^2}{2C} = \frac{d_{31}^2 k^2 F_y^2 h_A}{2\varepsilon_0 \varepsilon LW} \quad (5)$$

For the present hybrid transducer system 1 shown in FIG. 1, the two outer passive metal shells 18 and 19 are replaced with pre-curved piezoelectric multilayer stacks 11 and 12 having the following parameters: Length=L, Width=W, height=$h_B$, and thickness of each piezoelectric layer=t, and the banding layer is much thinner than the piezoelectric layer. Then, the number of layers of the multilayer stack is $$n = \frac{L}{t} \quad (6)$$

For each of the elements 11 and 12 the produced charge is $$Q_{B1} = Q_{B2} = \frac{1}{2} d_{33} F_x n = d_{33} n k F_y / 2 \quad (7)$$

The capacitance of each of the elements 11 and 12 is $$C_{B1} = C_{B2} = \varepsilon_0 \varepsilon \frac{S}{t} n = \varepsilon_0 \varepsilon \frac{W h_B n}{t} \quad (8)$$

The energy output for each of the elements 11 and 12 is $$P_{B1} = P_{B2} = \frac{Q_{B1}^2}{2C_{B1}} = \frac{d_{33}^2 n k^2 F_y^2 t}{8 \varepsilon_0 \varepsilon W h_B} \quad (9)$$

The total energy output for the presents hybrid energy harvesting system is $$P_{total} = 2P_{B1} + P_A = \frac{d_{33}^2 n k^2 F_y^2 t}{4 \varepsilon_0 \varepsilon W h_B} + \frac{d_{31}^2 k^2 F_y^2 h_A}{2 \varepsilon_0 \varepsilon LW} \quad (10)$$

The improvement ratio for the present hybrid transducer system is $$\chi = \frac{P_{total}}{P_A} = 1 + \frac{d_{33}^2 ntL}{2d_{31}^2 h_B h_A} = 1 + \frac{d_{33}^2 LL}{2d_{31}^2 h_B h_A} \quad (11)$$

If $$h_B = h_A/2 \quad (12)$$

Then, $$\chi = 1 + \left(\frac{d_{33}L}{d_{31}h_A}\right)^2 \quad (13)$$

For instance, L=20 mm, $h_A$=4 mm,

For PZT ceramic TRSHKIHD $d_{33}$=750 pC/N, and $d_{31}$=−360 μC/N

Then,
    $\chi$=109

For PMN-PT single crystal, $d_{33}$=2000 pC/N, and $d_{31}$=1000 pC/N

Then,
    $\chi$=101

If one replaces the $d_{31}$ element 14 with a $d_{33}$ multilayer stack (n layer) at same dimension, the produced charge for element 14 is $$Q'_A = d_{33}F_x n = d_{33}nkF_y \quad (14)$$

Capacitance is, $$C'_A = \varepsilon_0 \varepsilon \frac{S}{t} n = \varepsilon_0 \varepsilon \frac{Wh_A n}{t} \quad (15)$$

And, the output energy is $$P'_A = \frac{Q'^2_A}{2C_A} = \frac{d_{33}^2 nk^2 F_y^2 t}{2\varepsilon_0 \varepsilon Wh_A} \quad (16)$$

The improvement ratio is $$\chi' = 2\left(\frac{d_{33}L}{d_{31}h_A}\right)^2 \quad (17)$$

For the above example of the PZT the improvement ratio is 216 times and the Single crystal is 200 times.

Comparison the Energy Harvesting Capability of the Present Hybrid Transducer System with a Conventional Multilayer Stack Transducer For a conventional multilayer stack energy harvesting transducer, the force/stress is directly applied to the multilayer stack. However, the force/stress on the multilayer stacks in the present hybrid transducer system is amplified to M times by the pre-curved structure. The magnification constant M can be estimated with equation (1). A proper pre-curved condition can make the M constant larger than 100 times. Therefore, the energy harvesting capability for the present hybrid transducer system can be more than 100 times (if the element 14 is a single element) or 200 times (for the case of the multilayer element 14).

In summary, the energy harvesting capability of the present hybrid transducer system has the capability of an improvement ratio of over 100 times, comparing with either a conventional piezoelectric flextensional transducer or a conventional piezoelectric multilayer stack transducer with a proper pre-curved design.

EXAMPLE 1

A piezoelectric single crystal (piezoelectric constant $d_{31}$=1000 pC/N, $d_{33}$=2000 pC/N, and dielectric constant $\in$=8000) multilayer stack elements-based hybrid force/stress amplified piezoelectric energy harvesting transducer system according to the present invention has the flowing parameters:

Effective length of the transducer: $L_0$=10 mm

Width of the transducer: W=60 mm

Element 14: a single layer

Element 14 Dimensions: 10 mm long 4 mmhigh 60 mm wide

The pre-curved elements 11 and 12 are multilayer stacks (100 layers of 0.1 mm thick single crystal) with dimensions of 10 mm long, 2 mm high, and 60 mm wide. If the force amplification constant is k=100, and applied force, $F_{y1}$=80 N, the induced electric energy is 0.3035 (Joules/cycle). If we place 10 elements of this kind of device in each of a soldier's heels, and assume the average weight of a soldier is 80 kg (800N) and the average walking pace is two steps/second, then the harvested electric energy is 6.07 (Watts) for a normal soldier's walk.

EXAMPLE 2

A piezoelectric single crystal (piezoelectric constant $d_{33}$=2000 pC/N, and dielectric constant $\in$=8000) multilayer stack elements-based hybrid force/stress amplified piezoelectric energy harvesting transducer system according to the present invention has the flowing parameters:

Effective length of the transducer: $L_0$=10 mm

Width of the transducer: W=60 mm

Element 14: a multilayer stack (100 layers of 0.1 mm-thick single crystal)

Element 14 Dimensions: 10 mm long 4 mm high 60 mm wide

The pre-curved elements 11 and 12 are multilayer stacks (100 layers of 0.1 mm thick single crystal) with dimensions of 10 mm long, 2 mm high, and 60 mm wide. If the force amplification constant is k=100, and applied force, $F_{y1}$=80 N, the induced electric energy is 0.601 (Joules/cycle). If we place 10 elements of this kind of device in each of a soldier's heels, and assume the average weight of a soldier is 80 kg (800N), and the average walking pace is two steps/second, then the harvested electric energy is 12.02 (Watts) for a normal soldier's walk.

EXAMPLE 3

A piezoelectric PVDF polymer (piezoelectric constant $d_{33}=-35$ pC/N, dielectric constant $\in=11$) multilayer stack elements-based hybrid force/stress amplified piezoelectric energy harvesting transducer system according to the present invention has the flowing parameters.

Effective length of the transducer: $L_0=10$ mm

Width of the transducer: W=60 mm

Element 14: a multilayer stack (1000 layers of 0.01 mm-thick single crystal)

Element 14 Dimensions: 10 mm long 4 mm high 60 mm wide

The pre-curved elements 11 and 12 are multilayer stacks (1000 layers of 0.01 mm thick single crystal) with dimensions of 10 mm long, 2 mm high, and 60 mm wide. If the force amplification constant is k=100, and applied force, $F_{y1}=80$ N, the induced electric energy is 0.0308 (Joules/cycle). If we place 10 elements of this kind of device in each of a soldier's heels, and assume the average weight of a soldier is 80 kg (800N) and the average walking pace is two steps/second, then the harvested electric energy is 0.616 (Watts) for a normal soldier's walk.

CONCLUSION

The present hybrid force/stress amplified piezoelectric energy harvesting transducers utilize active materials based on strain/stress amplified mechanisms instead of compliant amplification in order to more efficiently convert mechanical energy into electric energy. Advanced single crystal piezoelectrics, electroactive polymers, and their composites are used in such transducers. The present transducers feature low volume, light weight, and high mechanical-to-electric power conversion efficiency. Specifically, both contraction and expansion components in the present transducer are made of advanced active materials, while piezoelectric energy harvesting transducers developed so far have only adopted one active component—either contraction or expansion.

In conventional piezoelectric transducers with amplification mechanisms, vibration energy transferred to the compliant amplification components is converted into heat and wasted. Vibration energy transferred to the active amplification components in the present transducer, however, is converted into electric energy simultaneously, thus leading to increased energy conversion efficiency. The present device does not need a power supply, nor does it consume other resources except the motion of force/stress; consequently, it will most likely function for an essentially unlimited period of time.

Energy harvesting devices according to the present invention can be used in a broad spectrum of applications, such as various military applications, wireless sensor networks, wireless communications, and handheld computers.

We claim:

1. A hybrid piezoelectric energy harvesting transducer system, which system comprises:

a. first and second symmetric, pre-curved piezoelectric elements in the form of sheets, each of which presents a convex and a concave major surface, the first and second symmetric, precurved piezoelectric elements being mounted separately at their ends on a frame so that the concave major surfaces of the piezoelectric elements are positioned opposite to each other;

b. a linear piezoelectric element in the form of a sheet having no curvature, the linear piezoelectric element mounted separately at its ends on the frame and positioned thereon between the first and second pre-curved piezoelectric elements and spaced therebetween;

c. the first and second pre-curved piezoelectric elements and the linear piezoelectric element all communicating with electrical energy harvesting circuitry having contact points which are located on the frame where the individual piezoelectric elements are mounted thereon; so that when a contracting force is applied to the center of the precurved piezoelectric elements in a direction perpendicular to the convex surfaces thereof, an amplified contracting force is produced along the pre-curved piezoelectric elements in a direction at right angles to the applied contracting force, and an equivalent stretching force is produced on the linear piezoelectric element; and when a stretching force is applied to the center of the pre-curved piezoelectric elements in a direction perpendicular to the concave surfaces thereof, an amplified stretching force is produced along the pre-curved piezoelectric elements in a direction at right angles to the applied stretching force, and an equivalent contracting force is produced on the linear piezoelectric element; each piezoelectric element inducing electrical energy simultaneously when a contracting force or a stretching force is applied thereto.

2. The hybrid piezoelectric energy harvesting transducer system of claim 1, wherein the pre-curved and linear piezoelectric elements comprise a piezoelectric material selected from the group consisting of piezoelectric ceramics, piezoelectric single crystals, piezoelectric polymers, and piezoelectric composites.

3. The hybrid piezoelectric energy harvesting transducer system of claim 2, wherein the pre-curved and linear piezoelectric elements are selected from the group consisting of single elements and multilayer stacks having one kind or more than one kind of piezoelectric material contained therein.

4. The hybrid piezoelectric energy harvesting transducer system of claim 2, wherein the piezoelectric ceramics are selected from the group consisting of lead zirconate titanate, barium titanate, lead magnesium niobate-lead titanate ceramic, lead zinc niobate—lead magnesium niobate—lead titanate ceramic, lead titanate, and lead lanthanum zirconate titanate.

5. The hybrid piezoelectric energy harvesting transducer system of claim 2, wherein the piezoelectric single crystals are selected from the group consisting of lead magnesium niobate—lead titanate single crystal, lead zinc niobate—lead titanate single crystal, barium titanate single crystal, strontium barium niobate single crystal, lithium niobate single crystal, lithium tantalate single crystal, and lead barium niobate single crystal.

6. The hybrid piezoelectric energy harvesting transducer system of claim 2, wherein the piezoelectric polymers are selected from the group consisting of polyvinylidene fluoride, poly(vinylidene fluoride-trifluoroethylene), and polyimides and polyimide based nano composites.

* * * * *